(12) United States Patent
Kondo

(10) Patent No.: US 6,469,242 B1
(45) Date of Patent: Oct. 22, 2002

(54) THIN-FILM SOLAR CELL MODULE AND METHOD OF MANUFACTURING THE SAME

(75) Inventor: Masataka Kondo, Kobe (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/517,599

(22) Filed: Mar. 2, 2000

(30) Foreign Application Priority Data

| Sep. 1, 1999 | (JP) | 11-247123 |
| Sep. 1, 1999 | (JP) | 11-247124 |
| Sep. 6, 1999 | (JP) | 11-251172 |

(51) Int. Cl.[7] .................. H01L 31/048; H01L 31/05; H01L 31/0224
(52) U.S. Cl. .................. 136/251; 136/244; 257/433; 438/66; 438/80; 438/64
(58) Field of Search ............... 136/251, 244; 257/433; 438/66, 80, 64

(56) References Cited

U.S. PATENT DOCUMENTS

| 4,292,092 A | 9/1981 | Hanak |
| 4,450,033 A | 5/1984 | Little |
| 5,593,901 A | 1/1997 | Oswald |
| 5,830,779 A | 11/1998 | Bressler et al. |
| 6,369,315 B1 * | 4/2002 | Mizukami et al. .......... 136/244 |

FOREIGN PATENT DOCUMENTS

| EP | 0769818 | 4/1997 |
| EP | 0829909 | 3/1998 |
| JP | 6-120533 | 4/1994 |
| JP | 9-83001 | 3/1997 |
| JP | 9-326497 | 12/1997 |
| JP | 9-326497 A | * 12/1997 |
| JP | 10-173209 | 6/1998 |
| WO | WO 97/21253 | 6/1997 |

OTHER PUBLICATIONS

Ser. No. 09/454,679, (Kondo, et al.) filed Dec. 3, 1999.
Ser. No. 10/026,208, (Yuzuru Kondoh) filed Dec. 21, 2001.
Office Action from European Patent Office, Jul. 31, 2001, Examiner Werner A M, Application No. 00 103 497.4–2203, 3 pages.
M. Kondo, et al.; Low–cost amorphous silicon photovoltaic module encapsulated with liquid resin; Solar Energy materials and Solar Cells 49 (1997) 127–133.
Patent Abstracts of Japan, Abstract for JP 9–326,497, Dec. 1997.

* cited by examiner

*Primary Examiner*—Alan Diamond
(74) *Attorney, Agent, or Firm*—Hogan & Hartson, LLP

(57) ABSTRACT

In a substrate-integration-type thin-film solar cell module wherein an element is directly formed on a transparent insulating substrate, wiring between a bus region and a terminal box is formed of a solder-plated copper foil. To ensure insulation between a device surface and the solder-plated copper foil, an insulating sheet buried in a filler is inserted in a gap therebetween. A glass nonwoven fabric sheet or a 160° C.-heat-resistant synthetic fiber fabric sheet can be used for the insulating sheet. Contact between an edge of an opening in a back protection cover and the wiring is prevented by positioning output wiring by means of an insulating sheet portion. An insulating sheet for preventing entrance of water from the opening is disposed at the opening.

30 Claims, 7 Drawing Sheets

THIN-FILM SOLAR CELL MODULE AND METHOD OF MANUFACTURING THE SAME

CROSS-REFERENCE TO RELATED APPLICATIONS

This application is based upon and claims the benefit of priority from the prior Japanese Patent Applications No. 11-247123, filed Sep. 1, 1999, No. 11-247124, filed Sep. 1, 1999 and No. 11-251172, filed Sep. 6, 1999; the entire contents of which are incorporated herein by reference.

BACKGROUND OF THE INVENTION

The present invention relates in general to a thin-film solar cell module and a method of manufacturing the same. In particular, this invention relates to an electrode lead-out structure and a method of fabricating the same in a thin-film solar cell module comprising a single thin-film solar cell or a combination of thin-film solar cells. The thin-film solar cell comprises a plurality of photovoltaic (PV) elements formed on a transparent insulating substrate.

Attention has been paid to sunlight power generation as means for overcoming environmental problems such as an exhaustion of natural resources or an increase in generation of carbon dioxide. Thin-film solar cells have attracted particular attention because the amount of semiconductor material to be used, such as silicon, is small.

Solar cells using crystalline silicon substrates have conventionally been put into practice. Compared to the solar cells, thin-film solar cells have a problem in that the efficiency of converting light to power is inferior by several-ten percentage. In an environment in which foot print for placing solar cells is limited, as in Japan, it is very important to increase as much as possible that portion of the area occupied by solar cell modules, which contributes to power generation, thereby reducing the gap in conversion efficiency between the solar cells and the thin-film solar cells.

As regards the solar cell using a crystalline silicon substrate, one solar cell is formed on one crystalline silicon substrate. Several-ten solar cells are connected to constitute a solar cell module. Since it is necessary to provide gaps for disposing a solar cell module and areas for disposing wiring for sending power of solar cell elements to connection means such as a terminal box, the area of a power generation section for converting light to power is set at about 70% to 80% of the entire area of the solar cell module. In the field of thin-film solar cell modules, a structure has been proposed wherein solar cell elements are formed directly on a transparent insulating substrate and the solar cell elements are connected on the substrate (hereinafter referred to as "substrate-integration-type solar cell module"). In the substrate-integration-type solar cell module, the area of the power generation section can be increased to more than 90% of the entire area occupied by the module.

U.S. Pat. No. 4,292,092 discloses a structure of a solar cell portion in the substrate-integration-type solar cell module, and a method of fabricating the same. According to the technique of U.S. Pat. No. 4,292,092, a transparent conductor film is provided on a transparent insulating substrate of, e.g. glass. The transparent electrode film is divided by a laser process into strip-shaped photovoltaic (PV) regions. P-type, i-type and n-type amorphous silicon is provided on the entire surfaces of the PV regions, and thus PV semiconductor layers are formed. Connection grooves for connecting adjacent solar cell elements are formed by a laser process in parallel to and away from a first line formed by a laser process. After a back electrode layer is formed, separation grooves are formed in the back electrode layer in parallel to the connection grooves and opposite to the separation grooves of the transparent conductor film. Through these processes, a thin-film solar cell is fabricated wherein a plurality of strip-shaped photovoltaic (PV) elements are connected in series on a single substrate.

Buses for outputting power from the thin-film solar cell is provided on the transparent insulating substrate. Since the buses are portions not contributing to power generation, they are formed of a material with good electrical conductivity to efficiently deliver generated power and are disposed on strip-shaped bus regions which are slightly narrower than the PV elements. Examples of the method of forming the buses are disclosed in Jpn. Pat. Appln. KOKAI Publication No. 3-171675 wherein a paste in which metallic particles of glass frit, etc. are dispersed is coated on bus regions, or in Jpn. Pat. Appln. KOKAI Publication No. 9-83001 wherein a solder-plated copper foil is disposed on bus regions by means of a solder for ceramics.

The solar cell module using the crystalline silicon substrate and the thin-film solar cell module have each a connection means (hereinafter referred to merely as "the connection means") for outputting power. A terminal box can be used for the connection means. The terminal box includes terminals, and wiring elements lead out of the solar cell module are connected via the terminals to an output power cable.

According to some examples of the connection structure between the bus and the connection means for the substrate-integration-type solar cell module, copper foils are arranged and connected on such a transparent support member as used in the crystalline silicon substrate solar cell in the same two-dimensional fashion as the crystalline silicon substrate, or a paste in which metallic particles of glass frit, etc. are dispersed is linearly coated on peripheral portions of the transparent insulating substrate where no PV elements are provided, as disclosed in Jpn. Pat. Appln. KOKAI Publication No. 3-171675.

There is such a problem with these methods that due to a large space needed for wiring an area for power generation in the limited area of the solar cell module is occupied.

To overcome this problem, Jpn. Pat. Appln. KOKAI Publication No. 9-326497 proposes a technique wherein wiring (solder-plated copper foils, etc.) for connecting the buses and the connection means is disposed in a filler for sealing photovoltaic (PV) elements. This document describes a prior-art method for maintaining electrical insulation between the wiring (copper foils) and PV elements, wherein an insulating film is used and a filler and a back cover are disposed on the insulating film. This document also describes an embodiment wherein copper foils are coated with insulating films.

The former method will now be described with reference to FIG. 2. Buses (solder-plated copper foils) 4, 4' are provided on bus regions 3, 3' on a thin-film solar cell 100. Wiring elements 5, 5' for connecting the buses and the aforementioned connection means are disposed between the solder-plated copper foils 4, 4'. An insulating film 7 is provided under the wiring elements 5, 5'. The wiring elements 5, 5' (two solder-plated copper foils) are connected at one end to the solder-plated copper foils 4, 4'. A filler film 9 and a back protection cover 13 are provided over the wiring elements. Openings 14 for taking out electrodes are formed in the back protection cover 13. In the state in which the solder-plated copper foils 5, 5' are led out of the back cover via the openings, the back protection cover 13 is thermally pressed with the filler film 9 interposed by means of a vacuum laminator and fixed on a glass substrate 1.

The latter method described in Jpn. Pat. Appln. KOKAI Publication No. 9-326497 will now be described with reference to FIG. 3. In FIG. 3, the wiring elements 5, 5' are replaced with copper foils 45, 45' formed by coating the two solder-plated copper foils 5, 5' with insulating films 15. In this method, the insulating film 7 used in the example of FIG. 2 is not used.

According to a resent research work, it is recognized that the method of Jpn. Pat. Appln. KOKAI Publication No. 3-171675 has a problem in that the characteristics of the solar cell module deteriorate due to a large area required for wiring.

It is also recognized by a modern research that the method shown in FIG. 2 permits easy assembly but no filler can be put under the solder-plated copper foils 5, 5'. Because of this problem, if the solder-plated copper foils 5, 5' are pulled from the openings 14, gaps are created between the solder-plated copper foils 5, 5' and insulating film 7.

According to a modern research, in the structure shown in FIG. 3, too, gaps are similarly created between the coated copper foils 45, 45' and the PV elements.

These thin-film solar cell modules were tested by an environmental test device at a humidity of 85% and a temperature of 85° C. After 1,000 hours, these thin-film solar cell modules were observed, and it turned out that water entered the above-mentioned gaps and back electrodes near the gaps corroded. Where the insulating films 15 were coated on the copper foils using an adhesive other than the filler, the color of the filler 9 near the insulating films 15 was changed to yellow.

The solar cell module is disposed on the roof, etc. of a house, and the temperature thereof rises up to about 80° C. The solar cell module is susceptible to such environmental effects. The life of about 20 years is required for solar cell modules for reasons of market needs. Thus, there are very strict requirements for reliability of solar cell modules. To meet the requirements, it is necessary to use materials whose reliability has been certified, to completely fill the inside of the solar cell modules with filler, and to eliminate any gap from the inside.

It has been recognized that there is such a problem that an edge portion of the opening 14 in the back protection cover comes in contact with the wiring element (solder-plated copper foil) 5, 5' with a very high possibility in the module fabricated by the method as shown in FIG. 2. Specifically, in this module, there is no means for restricting the positional relationship between the wiring and the opening. As a result, this module has such a structure that the wiring and the opening may come in contact with high possibility. Where a sheet including metallic material, such as a three-layer sheet of Tedler/Al/Tedler, is used for the back protection cover, a short-circuit may occur in the wiring elements 5, 5' due to the metallic material in the sheet. In another case where an aluminum frame is used as a frame, power may leak to the frame via metallic material in the back protection cover. Neither a means for protecting the filler at the opening nor a means for preventing water from entering via the opening is provided at the opening in the protection cover of the module having the structure shown in FIG. 2. This considerably decreases the reliability of the module.

In fact, it turned out that as regards the thin-film solar cell modules having the above structure, about 30% of products were defective. When accepted products were tested by an environmental test device for 1,000 hours at a humidity of 85% at a temperature of 85° C., entrance of water was observed at the opening.

In order to put sunlight power generation to wide and common use, it is necessary to reduce the price of sunlight power generation systems while meeting the above-described strict requirements for reliability. For this purpose, it is also necessary to improve the structure of solar cells and the method of manufacturing the same, thereby meeting the above requirements.

BRIEF SUMMARY OF THE INVENTION

The means for overcoming the above problems have been improved and developed, with the structure disclosed in Jpn. Pat. Appln. KOKAI Publication No. 9-326497 employed as a starting point, and simple and clear means as recited in the claims have been achieved.

According to a first aspect of the present invention, there is provided a thin-film solar cell module characterized by comprising:

a transparent insulating substrate;

a thin-film solar cell formed on the transparent insulating substrate;

a bus connected to the thin-film solar cell and formed on the transparent insulating substrate;

sealing means provided on a surface of the thin-film solar cell;

connection means for outputting power from the thin-film solar cell; and a wiring element for connecting the bus and the connection means, wherein the thin-film solar cell has on the transparent insulating substrate a plurality of photovoltaic elements each comprising a transparent electrode layer, a photovoltaic thin-film semiconductor layer and a back electrode layer, the sealing means comprises a filler and a back protection cover, the wiring element is buried in a filler, and an insulating sheet buried in a filler is disposed between the wiring element and the back electrode layer.

According to a second aspect of the invention, in the thin-film solar cell module according to the first aspect, the insulating sheet is one of a glass nonwoven fabric sheet and a 160° C.-heat-resistant synthetic fiber fabric sheet.

According to a third aspect of the invention, there is provided a thin-film solar cell module characterized by comprising:

a transparent insulating substrate;

a thin-film solar cell formed on the transparent insulating substrate;

a bus connected to the thin-film solar cell and formed on the transparent insulating substrate;

sealing means provided on a surface of the thin-film solar cell;

connection means for outputting power from the thin-film solar cell; and a wiring element for connecting the bus and the connection means, wherein the thin-film solar cell has on the transparent insulating substrate a plurality of photovoltaic elements each comprising a transparent electrode layer, a photovoltaic thin-film semiconductor layer and a back electrode layer, the sealing means comprises a filler and a back protection cover, the back protection cover having a metallic film therein and having an opening in which the wiring element is passed, and the sealing means further comprises at least one insulator covering the opening of the back protection cover.

According to a fourth aspect of the invention, there is provided a method of manufacturing a thin-film solar cell module, characterized by comprising the steps of:

forming a thin-film solar cell, the step of forming the thin-film solar cell including, forming a photovoltaic layer by successively stacking, on a transparent insulating substrate, a transparent electrode layer, a photovoltaic thin-film semiconductor layer and a back electrode layer, dividing the photovoltaic layer into a plurality of regions and forming a plurality of photovoltaic elements, and forming on the transparent insulating substrate a bus for deriving power from the photovoltaic elements;

forming a wiring element between the bus and connection means for deriving power from the thin-film solar cell; and forming sealing means including a filler and a back protection cover, wherein the step of forming the wiring element includes, disposing successively a filler, an insulating sheet and a filler on the thin-film solar cell and under the wiring element, and the step of forming the sealing means includes, disposing, on an entire surface of the thin-film solar cell, a filler sheet having an opening for leading out the wiring element to the connection means, and disposing, on the filler sheet, a back protection cover having a hole at a position corresponding to the opening of the filler sheet.

According to a fifth aspect of the invention, in the method of manufacturing a thin-film solar cell module according to the fourth aspect, the insulating sheet disposed under the wiring element is one of a glass nonwoven fabric sheet and a 160° C.-heat-resistant synthetic fiber fabric sheet.

According to a sixth aspect of the invention, there is provided a method of manufacturing a thin-film solar cell module, characterized by comprising the steps of:

forming a thin-film solar cell, the step of forming the thin-film solar cell including, forming a photovoltaic layer by successively stacking, on a transparent insulating substrate, a transparent electrode layer, a photovoltaic thin-film semiconductor layer and a back electrode layer, dividing the photovoltaic layer into a plurality of regions and forming a plurality of photovoltaic elements, and forming on the transparent insulating substrate a bus for deriving power from the photovoltaic elements;

forming a wiring element between the bus and connection means for deriving power from the thin-film solar cell; and forming sealing means including a filler and a back protection cover, wherein the step of forming the sealing means includes disposing an insulating sheet having an opening for passing the wiring element between the back protection cover and the filler sheet.

In the thin-film solar cell modules and the methods of manufacturing the thin-film solar cell modules according to the first to sixth aspects of the invention, it is preferable that the filler in which the wiring element is buried and the filler in which the insulating sheet is buried be formed of the same material as the filler of the sealing means.

It is also preferable that the insulating sheet have the same color tone as the back protection cover.

It is also preferable that the insulating sheet be formed of the same resin material as the back protection cover, and have the same color tone as the back protection cover.

It is also preferable that the wiring element be one of a copper wire and a copper foil which are coated with one of solder and tin.

It is also preferable that the filler in which the wiring element is buried and the filler in which the insulating sheet is buried be formed of a material having the same color tone as the back protection cover.

It is also preferable that the two fillers and the filler sheet disposed under the wiring element be formed of a material which is melted by heat and cross-linked.

It is also preferable that the filler in which the wiring element is buried and the filler in which the insulating sheet is buried be formed of one selected from the group consisting of ethylene-vinyl acetate copolymer (EVA), silicone, and polyvinylbutyral (PVB).

It is also preferable that at least one of the wiring element and the bus be a solder-plated copper foil having a width of 2 mm or more, and a thickness of solder of the solder-plated copper foil be 50 $\mu$m or more.

It is also preferable that at least one of the wiring element and the bus be a solder-plated copper foil having a width of 2 mm or more, and a thickness of solder of the solder-plated copper foil be 100 $\mu$m or more and 200 $\mu$m or less.

It is also preferable that the insulating sheet have the same color tone as the back protection cover.

It is also preferable that the insulator be an insulator sheet having an opening through which the wiring element is tightly passed, and the insulator sheet be disposed in a space between the back protection cover and the solar cell.

It is also preferable that the insulator be buried in the filler.

It is also preferable that the insulator be one of a fluorine-based resin film, a glass nonwoven fabric and a 160° C.-heat-resistant fiber nonwoven fabric.

It is also preferable that the insulator covering the opening of the back protection cover have one of a notch and an opening.

In the methods of manufacturing the thin-film solar cell modules according to the fourth to sixth aspects of the invention, it is also preferable that, following the step of forming the wiring element and the step of forming the sealing means, there be provided a step of fixing, by a vacuum lamination step, the thin-film solar cell, the back protection cover, and the filler, the filler sheet, the wiring element and the insulating sheet provided between the thin-film solar cell and the back protection cover.

It is also preferable that the two fillers and the filler sheet disposed under the wiring element be formed of the same material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings. The present invention is not limited to these embodiments and can be put to practice in other modes without departing from the spirit of the invention.

[Re: Thin-Film Solar Cell]

Figure 5:
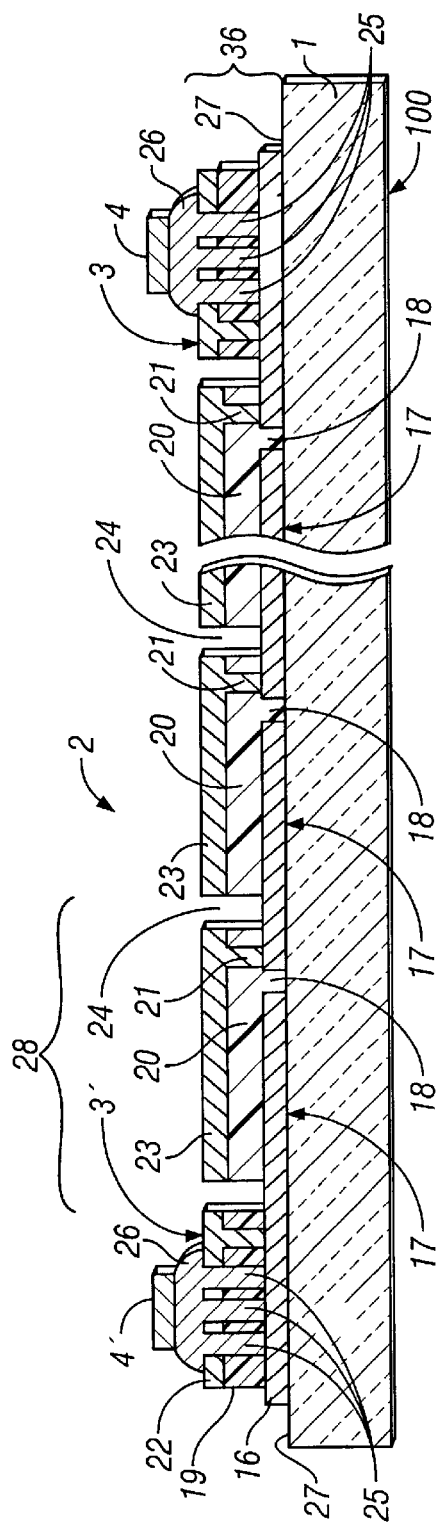
FIG. 5 is a cross-sectional view showing an example of a thin-film solar cell used in the present invention.
Figure 6:
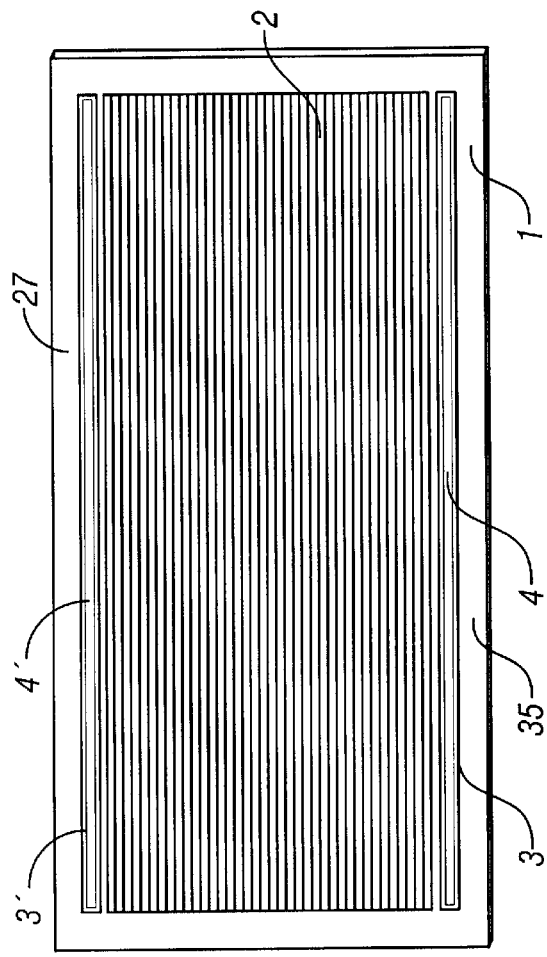
FIG. 6 is a plan view of the example of the thin-film solar cell used in the present invention.

FIG. 5 is a cross-sectional view showing an example of a thin-film solar cell used in the present invention, and FIG. 6 is a plan view of this example.

A transparent insulating substrate 1 used in a thin-film solar cell 100 may be formed of glass, heat-resistant plastic material, etc. A layer for preventing diffusion of impurities from the substrate 1 to a layer provided over the substrate 1 is provided on the substrate 1. This layer, for example, may be formed of $SiO_2$. A transparent electrode layer 16 is provided on this layer.

It is preferable that the transparent electrode layer 16 be formed of, e.g. $SnO_2$ with concaves and convexes being formed by apex angles of grown crystal grains. The transparent electrode layer 16 can be formed by thermal CVD.

The transparent electrode layer 16 is divided into strip-shaped individual regions 17 by grooves 18 formed by a laser process, etc.

Semiconductor layers 19 are formed on the transparent electrode layer. Photovoltaic junctions of amorphous silicon, thin-film poly-crystalline silicon, CIS, CdTe, etc. are formed in the semiconductor layers. A material which suits semiconductor is chosen as material of the transparent electrode.

Grooves 21 are provided in the semiconductor layers to form electrical connection paths between adjacent PV elements.

Back electrode layers 22 are formed on the semiconductor layer 19. It is preferable that the back electrode layers 22 be formed of a combination of a transparent conductive material, such as ZnO, and a high-reflectance metal such as Ag. The transparent electrode layer 16, semiconductor layer 19 and back electrode layer 22 constitute a photovoltaic (PV) layer 36.

The back electrode layers 22 are divided by grooves 24 to serve as individual electrodes 23. Thus, elements (PV elements) 28 sandwiched between the transparent electrodes and back electrodes are connected in series. Both ends of the series-connection of the elements 28 are connected to buses 4, 4' provided on bus regions 3, 3'. A plurality of grooves 25 for exposing the transparent electrode layer is formed in each bus region. A bump 26 of ceramic solder material is provided at the grooves 25. The ceramic solder material may be a solder mixed with a rare earth element for bonding with the transparent electrode or ceramic material, which is sold as "Cera-solzer" (trade name) manufactured by, e.g. Senju Kinzoku Kabushiki-Kaisha.

The bus (solder-plated copper foil) 4, 4' is connected to the bump 26. The solder-plated copper foil 4 may be a copper foil about 0.2 mm thick and several mm wide which is coated with an ordinary eutectic solder. By this coating, the anti-corrosion properties of the bus 4 are improved. In addition, the copper foil can be easily soldered to the bump merely by holding the copper foil on the bump by means of a soldering iron. As a result, an acid flux becomes unnecessary and there is no problem of flux remaining after sealing. The reliability is thus enhanced.

It is preferable to provide peripheral regions 27 of the substrate 1 with areas having no layers or grooves created by removing the respective layers. Such areas or grooves electrically isolate the solar cells from the ambience. In addition, adhesive force for adhering a filler (to be described later) to the areas or grooves increases. Thereby, the solar cells are isolated from ambient air or moisture.

FIG. 6 shows that side of the above-described thin-film solar cell, on which the PV elements are formed. A power generation region 2 is provided on a central part of the substrate 1. The back electrodes of the strip-shaped solar cell elements are formed on this power generation region 2. The bus regions 3, 3' and buses 4, 4' are provided on both sides of the substrate 1, and the peripheral region 27 is provided to surround the bus regions, etc. The gaps corresponding to the height of the solder bumps (see FIG. 5) are created between the surfaces of the bus regions and the buses (solder-plated copper foils) 4, 4'. It is preferable that the height of the gap be adjusted such that the gap may be filled with the filler.

[Re: Wiring]

A terminal box 44 (FIG. 1) may be used for the connection means for taking power out from the solar cell module. The location where the terminal box is disposed may be chosen according to the use of the solar cell module. In general, in most currently marketed solar cell modules using crystalline silicon substrates, the terminal box is disposed several cm from the center of the glass surface end at the shorter side of the module.

FIGS. 7A to 7G show a case where the terminal box is disposed about 5 cm from the center of the shorter side.

Figure 7A:
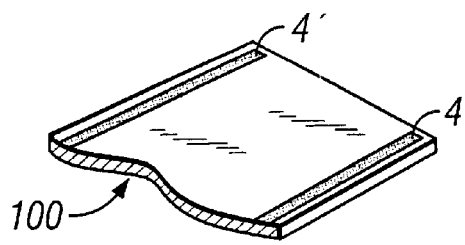
FIGS. 7A to 7G illustrate steps of forming wiring elements of the present invention.
Figure 7B:
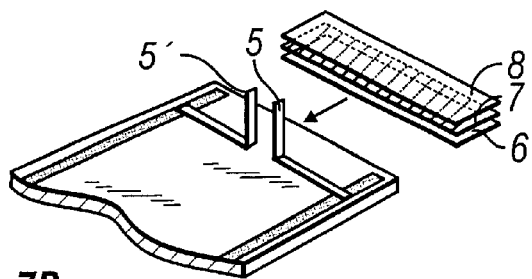

As is shown in FIG. 7B, the wiring element (solder-plated copper foil) 5, 5' is connected to a location about 5 cm from one end of the bus 4, 4' on the bus region 3, 3'. It is preferable that the solder-plated copper foil 5, 5' be formed of a material which suits electrical connection with metallic components within the terminal box. According to the inventor's experience, it is preferable to make the width of the solder-plated copper foil 4, 4' on the bus region narrower than 3 mm so that the copper foil (wiring element) 4, 4' may be extend ed over a relatively long distance on the bus region. on the other hand, it is preferable to make the width of the solder-plated copper foil 4, 4' greater than 1 mm so that the strength of adhesion of soldering on the solder bump may be greater than 1 kg. It is preferable that the width of the solder-plated copper foil 5, 5' for wiring to the terminal box be greater than the width of the solder-plated copper foil of the bus so that the solder-plated copper foil 5, 5' may have a sufficient strength. If the width of a connection terminal within the box is about 7 mm, it is preferable that the width of the solder-plated copper foil 5, 5' be about 5 mm. It is preferable that the thickness of the copper foil be 0.2 mm or less in view of workability.

The solder-plated copper foil 4, 4' and the solder-plated copper foil 5, 5' at the bus region can be connected by means of soldering. The soldering can be effected by placing and holding both on each other at the location of connection and fusing a solder on the foil by means of a soldering iron. The strength of soldering needs to be at least 1 kg. To obtain this strength, the thickness of the solder on the solder-plated copper foil should be set preferably at 50 $\mu$m or more, and more preferably at about 0.1 mm. Since the strength of the soldering is increased in accordance with the amount of solder, it is possible to add the solder to the location of connection during the soldering work. However, if the solder contains flux, there is a possibility that the metal will corrode, and the work for adding solder is time-consuming. It is thus preferable to obtain the strength of soldering by setting the thickness of the solder-plated on the copper foil 4, 4' at a proper value.

If the amount of solder decreases, the strength of soldering decreases. The reason is that there is unevenness of 0.1 mm or more on the surface of the copper foil and, unless the amount of solder plated on the copper foil is enough to bury or flatten the unevenness, a location of connection by soldering becomes a point, and not a surface area.

[Re: Insulating Sheet]

The insulating sheet 7 buried in the filler is disposed between the wiring elements, which are provided between the bus regions and the connection means for outputting power to the outside, and the surface of the solar cell element.

The filler 9 (FIG. 1) for the solar cell module may be in general formed of ethylene-vinyl acetate copolymer (EVA). The back protection cover 13 may be formed of fluorine-based film. In particular, Tedler of Du Pont can be used as material of the back protection cover 13. In order to prevent passing of moisture, a three-layer structure of Tedler/Al foil/Tedler is preferably used. This combination was found by the U.S. Jet Propulsion Laboratory (JPL) at the beginning of the 1980's as a most reliable combination after general study of materials and structures of solar cell modules using crystalline silicon substrates. For about 20 years since then, it has been used as a standard combination in the field of the art. This combination can be suitably used in the present invention. In these 20 years, companies in this technical field have developed substitutes which are less expensive and more reliable. In this invention, such substitutes may be adopted.

It is preferable to use a material, whose reliability has already been certified, as material of the insulating sheet 7. In order to ensure insulation, it is preferable that the insulating sheet contain no metal. A single sheet of Tedler may be preferably used. Alternatively, an inexpensive resin film of PET, etc. may be used if reliability is ensured.

A transparent sheet may be used as the insulating sheet 7. However, since the thin-film solar cell 100 has portions 24 (FIG. 5) where neither the semiconductor layer nor the back electrode layer is provided, these portions 24 are seen to be transparent if the thin-film solar cell is viewed from the light incidence side. In order to conceal the solder-plated copper foils from view, it is preferable to use a material, which has the same color tone as the filler of the back protection cover, as the material of the insulating sheet 7.

The length and width of the insulating sheet 7 may be properly chosen such that the wiring element 5, 5' may not come in contact with the solar cell elements (power generation region 2). In order to prevent the insulating sheet 7 from projecting after sealing, it is preferable that the thickness of the insulating sheet 7 be set at 30 $\mu$m to 100 $\mu$m. It is preferable to make the width of the insulating sheet 7 greater than that of the wiring element 5, 5'. In a case where the width of wiring element 5, 5' is 5 mm, if the width of the insulating sheet is set at 25 mm or more, insulation can be ensured even if the wiring element 5, 5' is displaced. FIG. 7B shows the insulating sheet 7 and fillers 6 and 8 sandwiching the sheet 7.

Where the aforementioned EVA is used as the fillers 6, 8, the fillers 6, 8 can be provided as thermoplastic sheets. In this case, the filler sheet 6, 8 may have the same shape as the insulating sheet or a shape slightly smaller than the insulating sheet. The filler sheets 6, 8 may be set in a predetermined position, with insulating sheet interposed. Portions of these sheets may be temporarily fixed by melting EVA in order to prevent mutual displacement. For the purpose of the temporary fixation, an electric iron (with a surface coated with Teflon), the temperature of whose face is heated up to 130° C., may be pressed on portions of these sheets. If the temperature of the electric iron is set at 160° C. or above, denaturing of EVA will occur.

There is a tendency that the insulating sheet 7 and EVA sheets 6 and 8, when heated, may shrink in the direction of stretching. To maintain precision in dimensions, it is effective to use a material produced by a special extruding method (e.g. two-axis stretching) by which sheets with less shrinkage can be obtained. Alternatively, it is effective to measure in advance the thermal shrinkage in each direction of the sheets and to set the direction with less shrinkage to be the longitudinal direction in which precision is required. Alternatively, it is necessary to use sheets which are preheated to stabilize the precision in dimensions. The insulating sheet and fillers may be disposed selectively before or after the solder-plated copper foils 5, 5' are disposed.

[Re: Glass Nonwoven Fabric Sheet and 160° C.-Heat-Resistant Synthetic Fiber Nonwoven Fabric]

It is preferable that a glass nonwoven fabric sheet or a 160° C.-heat-resistant synthetic resin nonwoven fabric sheet 7 be disposed between the wiring element, which is provided between the bus and the connection means for outputting power from the bus, and the device surface of the solar cell.

It is preferable to use a material, whose reliability has already been certified, as material of the glass nonwoven fabric sheet or a 160° C.-heat-resistant synthetic fiber nonwoven fabric sheet 7.

Glass nonwoven fabric has very good permeability of filler and sure insulative properties. It was certified by the Jet Propulsion Laboratory (JPL) that a specified product called "CraneGlas230" has good properties. Recently, there is known a fabric bound with acrylic fibers having higher reliability than long glass fibers, or a fabric subjected to a priming process to improve adhesiveness with resin. Such materials may be used as desired.

Synthetic fiber nonwoven fabrics with heat resistance have recently been sold for uses in electronic industries. In these fabrics, fibers with heat resistance of about 160° C., such as acrylic fibers, are used. Compared to glass nonwoven fabrics, these synthetic fiber nonwoven fabrics have improved adhesiveness with fillers.

When the thickness of the glass nonwoven fabric sheet or 160° C.-heat-resistant synthetic fiber nonwoven fabric sheet 7 is determined, it is necessary to consider that the volume thereof is reduced by compression in a vacuum lamination process. This thickness should preferably be 0.1 to 0.4 mm.

Figure 1:
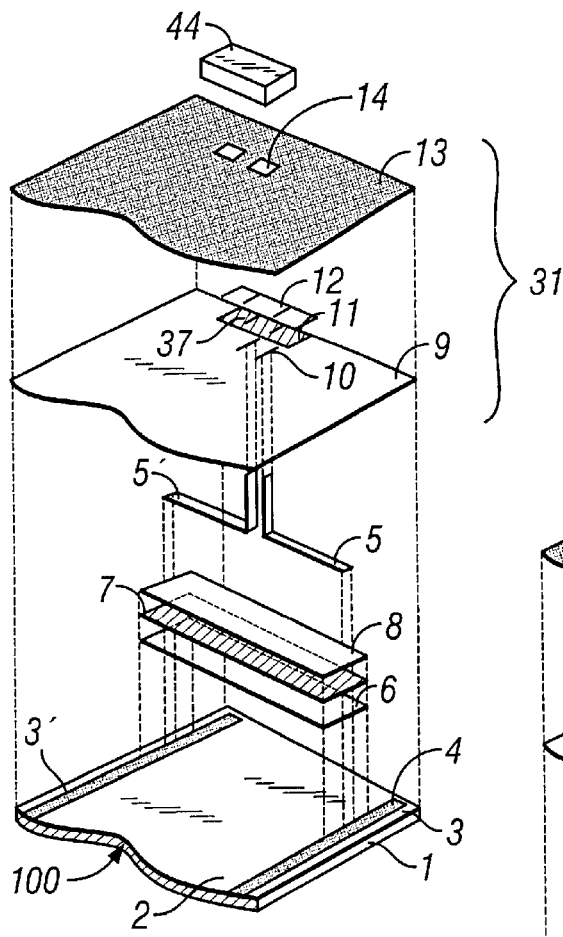
FIG. 1 is a perspective view showing, in a stacked manner, respective members of a thin-film solar cell module according to the present invention.
Figure 2:
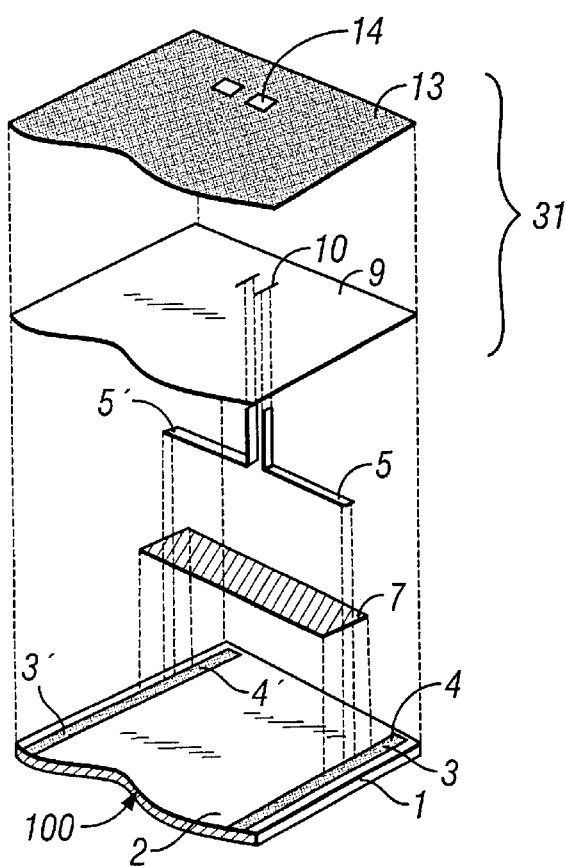
FIG. 2 is a perspective view showing, in a stacked manner, respective members of a conventional thin-film solar cell module.
Figure 3:
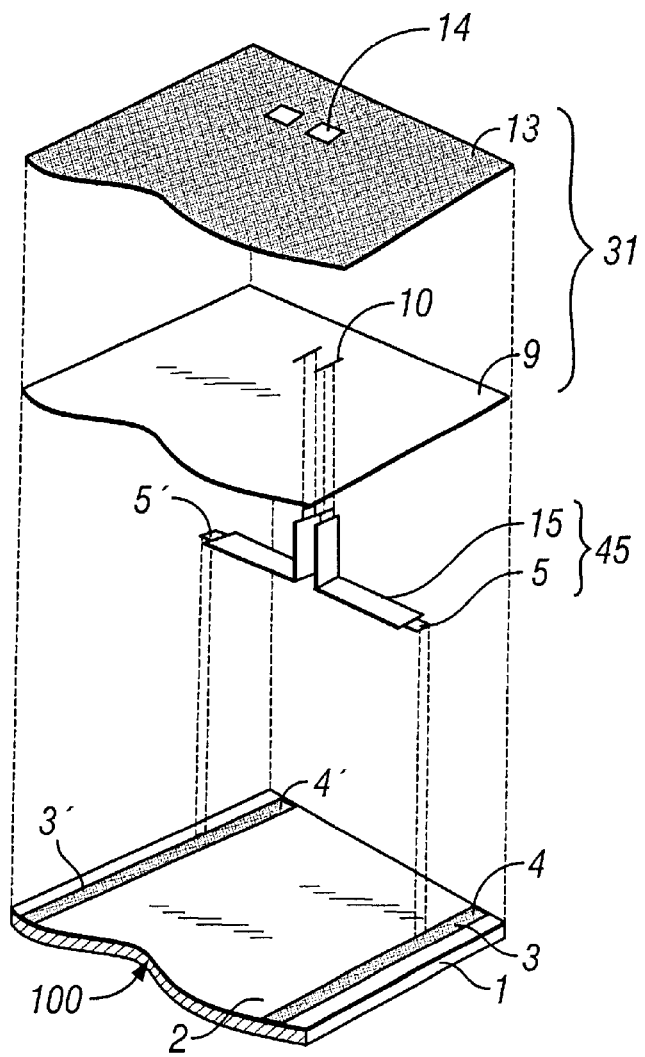
FIG. 3 is a perspective view showing, in a stacked manner, respective members of an improved conventional thin-film solar cell module.
Figure 4:
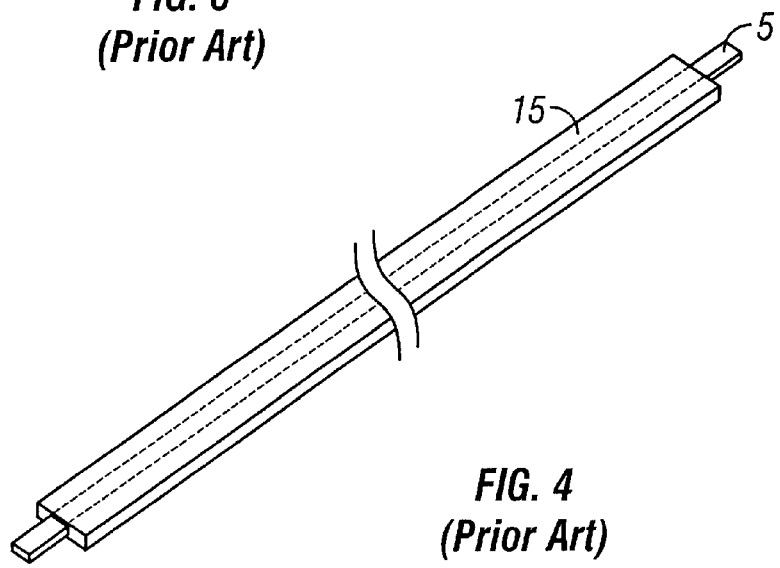
FIG. 4 shows a structure of an improved conventional wiring element.

In the manufacturing process, in order to ensure insulation between the wiring elements (solder-plated copper foils), which lie between the buses and the terminal box, and the solar cell elements, it is preferable to dispose a stacked structure of a glass nonwoven fabric 7 and at least one filler sheet 6 between them (FIG. 1). With the disposition of this stacked structure, the filler is melted and completely impregnated in the nonwoven fabric in the vacuum lamination process. Moreover, the wiring elements (solder-plated copper foils) 5, 5' are completely separated from the device surface 2 of the solar cell, and both will never come in contact with each other. Since the glass nonwoven fabric consists mainly of glass, it has a refractive index of about 1.5, which is substantially equal to that of the filler. As a result, if the filler is impregnated in the glass nonwoven fabric, the glass nonwoven fabric becomes transparent. The thin-film solar cell 100 has portions 24 where neither the semiconductor layer nor the back electrode layer is provided. These portions 24 are seen to be transparent if the thin-film solar cell is viewed from the light incidence side. In order to conceal the solder-plated copper foils from view, it is preferable to use a material, which has the same color tone as the filler of the back protection cover, as the material of the filler 6.

It is preferable to make the width of the glass nonwoven fabric sheet or 160° C.-heat-resistant synthetic fiber nonwoven fabric sheet 7 greater than the width of the wiring element (solder-plated copper foil) 5, 5'. In the manufacturing work, if the width of the glass nonwoven fabric sheet is set at 25 mm or more, compared to the width of the solder-plated copper foil 5, 5' which is 5 mm, insulation can be ensured even if the solder-plated copper foil 5, 5' is displaced. FIG. 11B shows the glass nonwoven fabric sheet or 160° C.-heat-resistant synthetic fiber nonwoven fabric sheet 7 and the filler 6 for sandwiching the sheet 7.

Where EVA is used as the filler 6, the filler 6 can be provided as a thermoplastic sheet. In this case, the filler sheet 6 is processed to have the same shape as the insulating sheet 7. The filler sheets 6 may be set in a predetermined position, with insulating sheet 7 sandwiched, or single filler sheet 6 may be set in a predetermined position, with single filler sheet 6 and insulating sheet 7 stacked. Portions of these sheets may be temporarily fixed by melting EVA in order to prevent mutual displacement.

Specifically, an electric iron (with a surface coated with Teflon), the temperature of whose face is heated up to 130° C., may be pressed on portions of the stacked structure of filler sheet 6 and insulating sheet 7, whereby the temporary fixation can be effected. If the temperature of the electric iron is set at 160° C. or above, denaturing of EVA will occur.

[Re: Disposition of the Back Protection Cover]

As is shown in FIG. 7B, end portions of wiring elements (solder-plated copper foils) 5, 5' which connect the buses to the connection means for outputting power to the outside are bent vertically upward to the substrate at locations where the terminal box is to be disposed. As is shown in FIG. 7C, the end portions of the wiring elements are inserted into slits 10 formed in the filler sheet 9 which covers the entire surface of the substrate. Where the filler sheet 9 formed of EVA is to be used, the size of the filler sheet 9 is set to be slightly greater than that of the filler sheet 9. Thereby, even if the aforementioned thermal shrinkage occurs, there is no problem. Generally speaking, it is preferable that the filler sheet 9 be longer than the substrate by 2% to 5%. Since the slits 10 for passing the solder-plated copper foils 5, 5' need to be covered with the filler excluding the portions where the copper foils are inserted, it is preferable to make the slits 10 as thin as possible.

The back protection cover 13 may be provided with openings 14, like the filler sheet 9. Where a cover including a metallic layer, such as a three-layer sheet of Tedler/Al foil/Tedler, is used as the back protection cover 13, if the wiring elements (solder-plated copper foils) 5, 5' and the metallic layer come in electrical contact with each other at the opening 14, all output of the solar cell is short-circuited via the metallic layer and lost. In another case, if one of the wiring elements 5, 5' comes in contact with the metallic layer, power will leak from the back protection cover 13 via the frame of the module or attachment members. The Japanese Industrial Standards stipulate that the withstand voltage between the frame, metal fittings, and output terminals should be more than a value calculated by adding 1 kV to double the system voltage to be used. To meet this standard, too, a measure needs to be taken to prevent the above-mentioned contact.

As such a measure, there is a method in which the openings 14 formed in the back protection cover 13 are made larger than the wiring elements 5, 5', and another insulating sheet 11 having slits, which are larger than the openings 14 in the protection cover and pass the wiring elements 5, 5', is disposed between the filler sheet 9 and back protection cover 13.

Figure 7E:
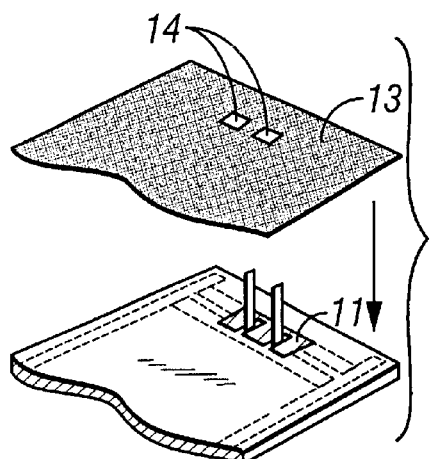
Figure 7C:
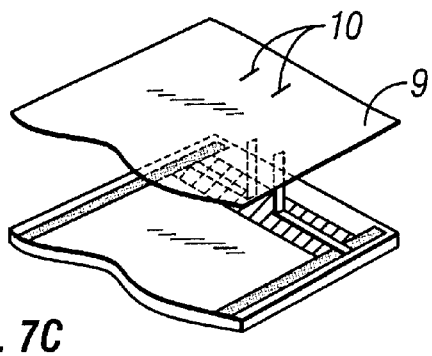
Figure 7F:
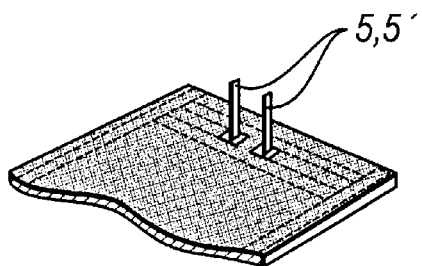
Figure 7D:
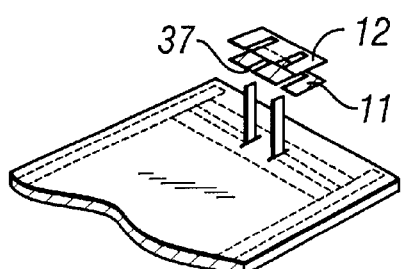
Figure 7G:
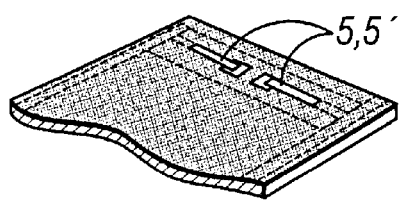

A specific method is illustrated in FIGS. 7D and 7E. An insulating sheet 11 having slits 37, which are slightly larger than the openings in the protection cover, is disposed on the filler sheet 9. This insulating sheet 11 may be formed of a Tedler sheet. The end portions of the wiring elements 5, 5' are penetrated through the slits in the insulating sheet 11. In addition, a filler sheet 12 having substantially the same size is disposed. This filler sheet 12 may be formed of a EVA sheet. Subsequently, the protection cover is disposed.

In the above method employed as the measure to prevent the contact, a glass nonwoven fabric sheet portion or 160° C.-heat-resistant synthetic fiber nonwoven fabric sheet portion 11 can be suitably employed as the insulating sheet 11.

According to another embodiment of the invention, the glass nonwoven fabric sheet portion or 160° C.-heat-resistant synthetic fiber nonwoven fabric sheet portion 11 may be replaced with a glass nonwoven fabric sheet or 160° C.-heat-resistant synthetic fiber nonwoven fabric sheet having the same size as the filler sheet 9. A problem in this case is that the cost of the nonwoven sheet increases. Where a cover including a metallic layer, such as a three-layer sheet of Tedler/Al foil/Tedler, is used as the back protection cover 13, however, it is possible to prevent the problem: a projection, which may occur on the wiring element or solder of the solder-plated copper foil, etc., will break the resin layer of Tedler, etc. and come in contact with the metallic layer in the back protection cover sheet.

A sheet in which EVA and glass nonwoven fabric are stacked is commercially available. This type of sheet is particularly effective for the above-mentioned insulation as well as insulation between the wiring elements 5, 5' and the device surface 2.

Since the glass nonwoven fabric is free from thermal shrinkage and has resiliency, it is thus easy to handle and also very easy to put to practical use.

The end portions of wiring elements 5, 5' are lead out of the openings in the protection cover and temporarily fixed by means of a heat-resistant tape at locations where the wiring elements do not come in contact with the opening. With this temporary fixation, displacement of wiring elements is prevented in the vacuum lamination process, and electrical short-circuit is also prevented (see FIGS. 7F and 7G).

[Re: Vacuum Lamination Process]

The solar cell module assembled through the above steps can be heated and pressed by means of, e.g. a double vacuum chamber type laminator (hereinafter referred to as "vacuum laminator"). This vacuum laminator may have a vacuum chamber which is separated into upper and lower vacuum chambers by a rubber diaphragm. The solar cell module is set in the vacuum laminator in the state in which its substrate is directed downward.

The upper and lower vacuum chambers are evacuated at about 100° C. and the solar cell module is deaerated. The finally attained degree of vacuum in this case is about 0.5 torr. In this process, the EVA is melted and bubbles, etc. in the EVA are eliminated. Subsequently, atmospheric air is introduced into the upper vacuum chamber. Due to the atmospheric pressure of air, the solar cell module is pressed. In this state, the solar cell module is heated up to about 150° C. and the EVA is cross-linked. The time needed for crosslinking was about 15 minutes in 1980 or thereabouts, but a fast-cure product has recently been put on the market and the time has reduced to about 2 minutes.

The filler or material of the protection cover, which has extruded to the periphery of the assembled thin-film solar cell module, is removed, and the frame, terminal box, etc. are attached to predetermined positions.

Figure 8A:
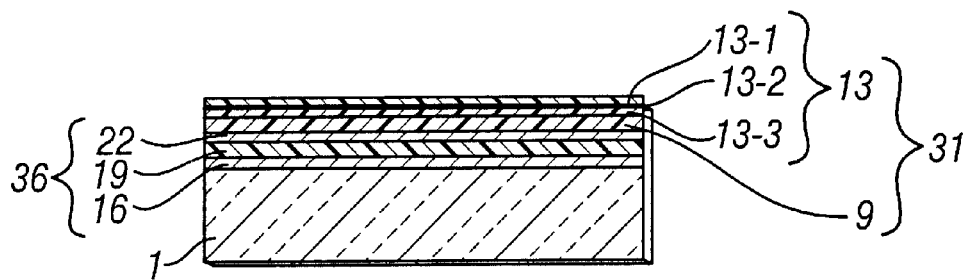
FIGS. 8A and 8B are cross-sectional views showing a wiring portion of the present invention.
Figure 8B:
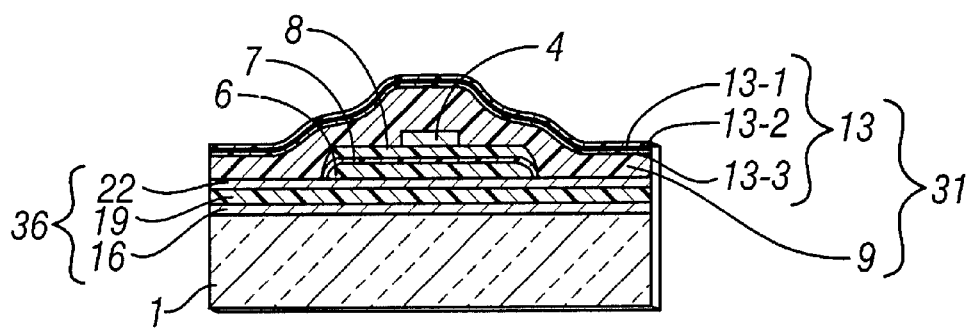
Figure 9:
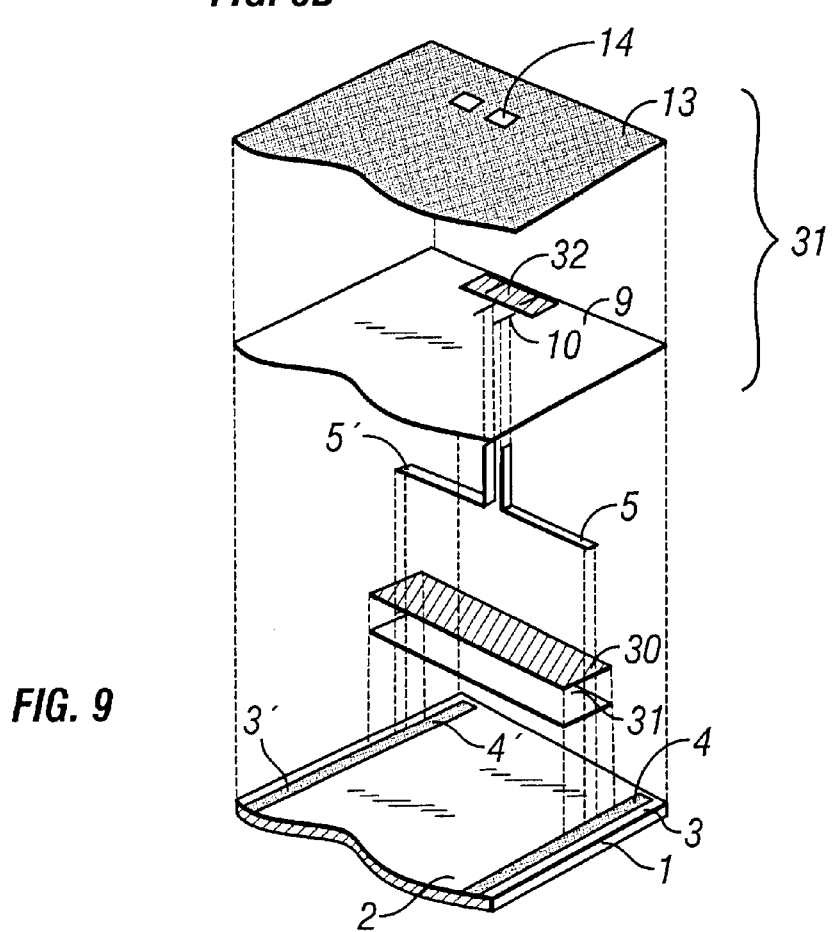
FIG. 9 is a perspective view showing, in a stacked manner, respective members where a glass nonwoven fabric is used as an insulating sheet.
Figure 10A:
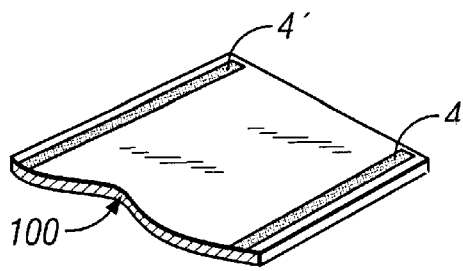
FIGS. 10A to 10D illustrate steps of forming another example of wiring elements according to the present invention.
Figure 10C:
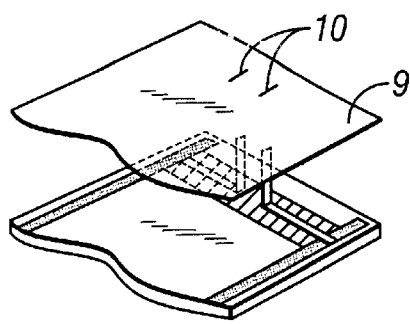
Figure 10B:
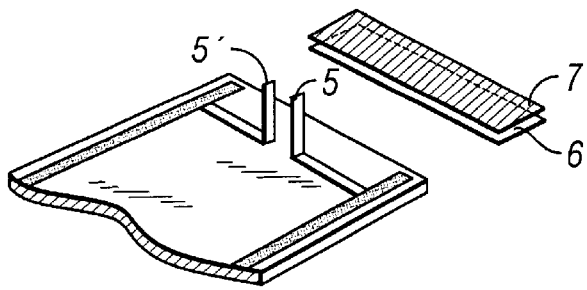
Figure 10D:
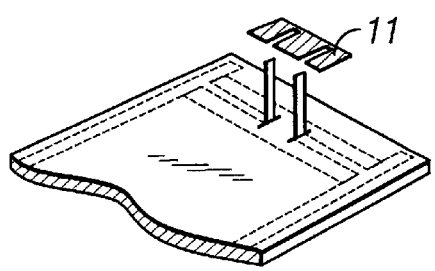

FIGS. 8A and 8B show the stacked state of sheets of the thin-film solar cell module fabricated through the above steps.

As is shown in FIG. 8A, that portion of the thin-film solar cell module, which excludes the peripheral portion of the wiring element, comprises two layers, i.e. the filler and protection cover. The peripheral portion of the wiring element, as shown in FIG. 8B, comprises a three-layer structure of the filler layer (6, 8, 9), insulating sheet (7) and solder-plated copper foil (4). This portion of three-layer structure has a swelling external shape, and a stress of the sealing member is concentrated at this portion.

To overcome this problem, the thickness of the filler which is newly adopted in the present invention may be set at about 0.2 mm in a case where the thickness of the main filler is about 0.4 mm.

In addition, in order to overcome problems in workability of the insulating portion and the external appearance in this invention, it is preferable to use a glass nonwoven fabric as the insulating sheet.

Glass nonwoven fabric has very good permeability of filler and sure insulative properties. It was certified by the Jet Propulsion Laboratory (JPL) that the product "Crane-Glas230" has good properties. Recently, there is known a fabric bound with acrylic fibers having higher reliability than long glass fibers, or a fabric subjected to a priming process to improve adhesiveness with resin. Such materials may be used as desired.

Where the glass nonwoven fabric is used as the insulating film, the volume thereof decreases in the vacuum lamination process. Taking this into account, it is preferable to use a glass nonwoven fabric which is thicker than a resin film. The thickness of the glass nonwoven fabric should preferably be 0.1 to 0.4 mm.

In order to ensure insulation between the wiring elements, which are provided between the buses and the terminal box, and the solar cell elements, a stacked structure of a glass nonwoven fabric 30 and a single filler sheet 31 may be interposed. Where an insulating sheet of a resin film is used, the insulating sheet is not buried unless filler layers are provided on both sides of the insulating sheet. Where a glass nonwoven fabric is used as an insulating sheet, the filler can be impregnated in internal spaces of the nonwoven fabric. Thus, if the filler is disposed only on one side of the insulating sheet, the insulating sheet can be buried in the filler. As regards the insulation of the opening in the back protection cover, it should suffice if only one glass nonwoven fabric 32 is disposed, and there is no need to use a filler sheet because the EVA of the filler sheet 9, which lies under the glass nonwoven fabric and has the same size as the substrate, is impregnated into the glass nonwoven fabric.

As has been described above, since the number of filler sheets is reduced, the increase in thickness of the peripheral portion of the wiring element can be greatly suppressed and the manufacturing work is facilitated. Since the glass nonwoven fabric has less thermal shrinkage and resiliency, it is thus easy to handle. With the use of the glass nonwoven fabric, the process of manufacturing the thin-film solar cell module can be simplified.

FIGS. 8A and 8B show the structure of the thin-film solar cell module using the glass nonwoven fabric. Compared to the case where the glass nonwoven fabric is used, the number of components can be remarkably reduced.

Figure 12A:
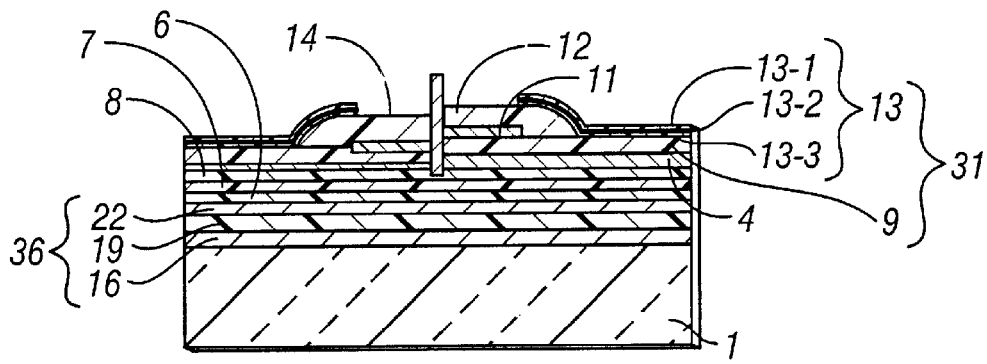
FIGS. 12A and 12B are cross-sectional views of opening portions in solar cell back protection covers according to other embodiments of the invention.

Another vacuum lamination step will now be described. FIG. 12A is a cross-sectional view showing in detail the portion including the opening in the back protection cover. An insulating sheet 11 having a larger area than the opening 14 in the back protection cover 13 is disposed under the opening. The insulating sheet 11 is buried in the fillers 9 and 12. It is preferable that the insulating sheet be formed of the same kind of material as the back film and that the insulating sheet not include a conductor layer. For example, where the three-layer sheet of Tedler/Al foil/Tedler is used as the back protection cover, a sheet of Tedler alone can be used as the insulating sheet. Where the three-layer sheet is not disposed at the opening 14 of the back protection cover, the vapor-barrier performance at the opening 14 considerably decreases. To overcome this problem, it is effective to use the insulating sheet 11 which includes no metallic foil and has vapor-barrier properties, like a Tedler/PET/Tedler three-layer sheet.

Where the glass nonwoven fabric is used as the insulating sheet 11, the volume thereof decreases because it is pressed in the vacuum lamination process. Taking this into account, it is preferable to use a glass nonwoven fabric which is thicker than a resin film. The thickness of the glass nonwoven fabric should preferably be 0.1 to 0.4 mm. In order to ensure the insulation of the opening 14 in the back protection cover, it should suffice if only one glass nonwoven fabric 32 (FIG. 12B) is disposed, and there is no need to use the filler sheet 12 (FIG. 12A) because the EVA of the filler sheet 9, which lies under the glass nonwoven fabric and has the same size as the substrate, is impregnated into the glass nonwoven fabric.

Making use of this impregnation, the glass nonwoven fabric 32 with a small area may be replaced with a glass nonwoven fabric sheet with the same size as the filler sheet 9, according to another embodiment of the invention. Recently, an integrated material of an EVA sheet and a nonwoven sheet has been put on the market. If this material is used, the glass nonwoven fabric can be disposed in the same step as the step of disposing the EVA sheet 9. Moreover, where a projection forms for some reason on the above-described wiring element of solder-plated copper foil or solder bump, it is possible to prevent damage to the back protection sheet due to the projection or contact between the metallic layer and the wiring element due to breakage of the resin film layer of the back protection sheet. Since the unit price of glass nonwoven fabric is not higher than 10% of the unit price of the material of the back protection cover, this embodiment is feasible from a standpoint of cost.

Since the glass nonwoven fabric is free from thermal shrinkage and has resiliency, it is thus easy to handle and the manufacturing steps can be facilitated.

Figure 12B:
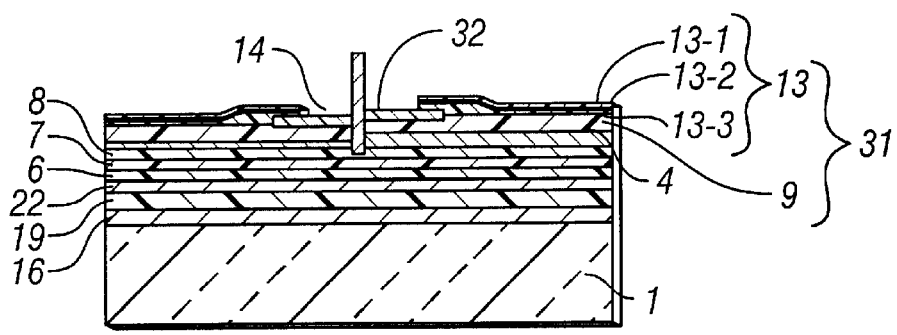

FIG. 12B shows a structure where the glass nonwoven fabric is used. In this structure, a glass nonwoven fabric portion 32 having an area slightly greater than the opening 14 in the back protection cover is used. This fabric portion is impregnated with filler 9.

Figure 13A:
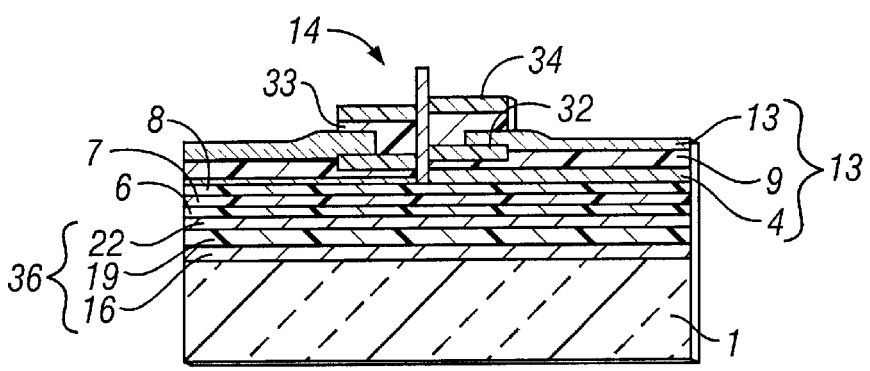
FIGS. 13A and 13B are cross-sectional views of opening portions in solar cell back protection covers according to other embodiments of the invention.

FIG. 13A shows another embodiment wherein the glass nonwoven fabric is used.

Since vapor easily enters from the opening 14 in the back protection cover, as mentioned above, it is necessary to cover the opening portion with a vapor-barrier means. In this example, a barrier sheet 34 is put over the opening 14. The sheet 34 may preferably be formed of the above-mentioned Tedler/PET/Tedler three-layer sheet, a PET sheet, or a film formed by coating a resin film with an inorganic layer of $SiO_2$, etc. The back protection cover 13 may be formed of the aforementioned Tedler/PET/Tedler three-layer sheet, or other materials (e.g. Tedler/Al/Tedler, glass).

Figure 13B:
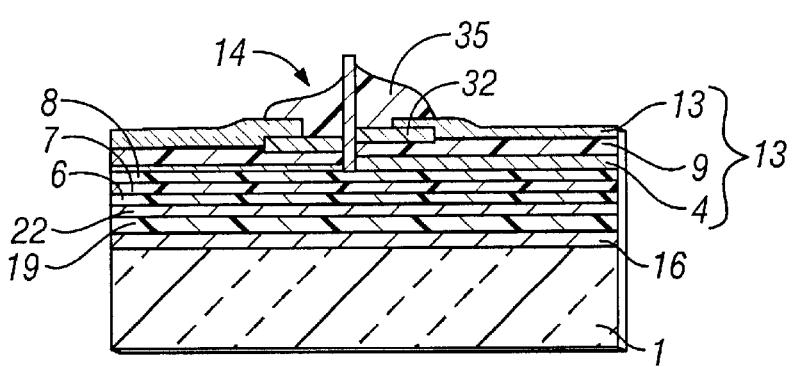

In connection with this technique, a resin 35 with barrier properties may be disposed at the opening 14, as shown in FIG. 13B. The resin 35 may be a rubber-based filler to be disposed after completion of the module by a potting method, or a sheet-like adhesive resin with barrier properties. Examples of the former are polyisobutylene and urethane, and examples of the latter are a hot-melt type adhesive used in packaging an IC. However, other materials may be used.

As has been described, using the structure and manufacturing method of the present invention, the space between the back protection cover and glass substrate is filled with components, such as wiring elements, and fillers. With the filling of the space, the thin-film solar cell module having no gap can be easily obtained. According to the present invention, contact between the wiring elements and back protection cover can be prevented. In the above description, specified materials are used for the materials of the respective components. However, other materials may be used for the components. In the above description, a pair of bus regions, a pair of buses, and a single terminal box are used. The number of these components, however, is not limited to these. The present invention is applicable to cases, as disclosed in Jpn. Pat. Appln. KOKAI Publication No. 3-171675, where a plurality of series-connected integrated solar cells are formed on a single substrate and these integrated solar cells are connected in parallel to one terminal box.

Figure 11A:
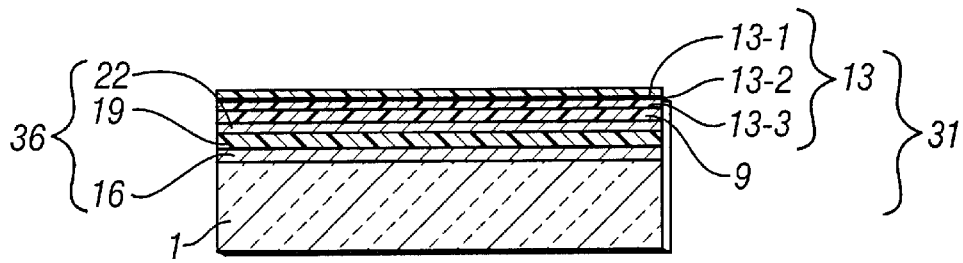
FIGS. 11A and 11B are cross-sectional view showing another wiring portion according to the invention.
Figure 11B:
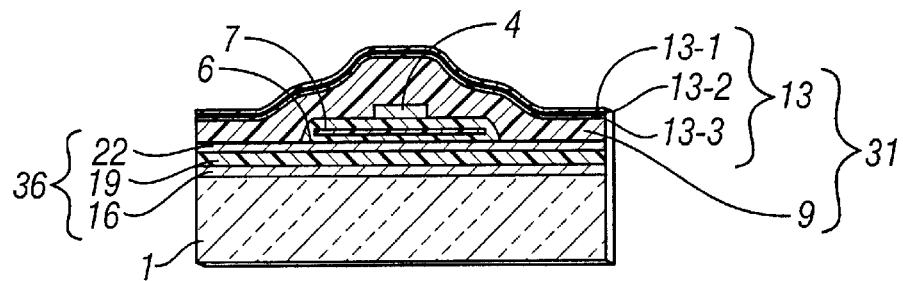

FIGS. 11A and 11B show other structures wherein sheets are laminated.

The peripheral portion of the wiring element of the thin-film solar cell module, as shown in FIG. 11A, has a two-layer structure of a filler and a protection cover. The back protection cover may have a three-layer structure of Tedler (13-1)/Al (13-2)/Tedler (13-3). The peripheral portion of the wiring element, as shown in FIG. 11B, has a region where two filler layers (6, 9), one nonwoven fabric layer 7, a bus (solder-plated copper foil) 4 are stacked inside the protection cover 13. The thickness of this region is theoretically about double the thickness of the other region. In actuality, however, the filler spread to the surrounding region and an increase in thickness of this region is very small.

In order to more reduce the increase in thickness of this region, it is preferable to set the thickness of the filler which is newly adopted in the present invention at about 0.2 mm in a case where the thickness of the main filler is about 0.4 mm.

EXAMPLE

A detailed description will now be given of a specific application of the present invention to a case where an amorphous silicon solar cell is fabricated on a glass substrate by using EVA and a three-layer structure film of Tedler/Al foil/Tedler.

Example 1

A blue plate glass having a shorter side of 50 cm, a longer side of 100 cm and a thickness of 4 mm was used as a transparent insulating substrate. Cut peripheral edges of the plate glass were chamfered to prevent thermal cracks or mechanical breakage during a manufacturing process.

As an alkali barrier, $SiO_2$ was deposited to a thickness of 1,000 Å on the glass by a thermal CVD process. As a transparent conductor layer 16, fluorine-doped $SnO_2$ was provided to a thickness of 10,000 Å. The surface of the transparent conductor layer 16 had unevenness due to apex angels of crystal grains.

Grooves 18 were formed in the transparent electrode layer 16 by a laser process using second harmonic of a YAG laser.

A semiconductor layer 19 comprising p-type amorphous silicon carbide of 100 Å, i-type amorphous silicon of 3,000 Å and n-type amorphous silicon of 300 Å was formed on the resultant structure by a plasma CVD process.

Using second harmonic of the YAG laser, a groove 21 for electrical connection with an adjacent photovoltaic (PV) element was formed.

As a back electrode layer 22, ZnO of 1,000 Å and Ag of 3,000 Å was provided on the semiconductor layer 19 by a sputtering process.

Grooves 24 were formed in the back electrode layer 22 using second harmonic of the YAG laser, thereby constituting individual electrodes 23. Through this step, the semiconductor was sandwiched between the transparent electrode and back electrode and series-connected unit elements 28 were formed. The width of the unit element was about 10 mm.

Similarly, through a laser process, bus regions 3, 3' each with a width of 5 mm for deriving power were provided at both ends of these connected elements. A distance of 48 cm was provided between the positive bus region 3' and negative bus region 3. A plurality of grooves 25 for exposing the transparent electrode layer were provided in the bus region 3, 3'. Bumps of Cerasolza were provided at the regions of grooves 25 at intervals of 2 cm by means of an ultrasonic soldering iron.

A bus (solder-plated copper foil) 4 having a width of 2 mm, a thickness of 0.2 mm and a solder thickness of 0.1 mm was connected to the bump.

A peripheral region of the substrate 1 was polished by a sandblasting process, and a region where all layers on the substrate were removed was provided.

A gap was provided between the solder-plated copper foil 4, 4' on the bus region and the surface of the bus region, and this gap was set at about 0.1 mm so as to be filled with a filler.

A wiring element (solder-plated copper foil) 5, 5' having a length of 30 cm and a width of 5 mm was connected to a position which is 5 cm from an end of the solder-plated copper foil 4, 4' on the substrate. The thickness of the wiring element and the solder thickness of the wiring element were equal to those of the bus (solder-plated copper foil).

The connection between the solder-plated copper foils was effected by fusing solder on the copper foils by a soldering iron, with both foils placed on each other at the location of connection.

A three-layer sheet comprising an EVA sheet 6 having a length of 48 cm, a width of 2.5 cm and a thickness of 0.4 mm, a Tedler sheet 7 having a thickness of 0.05 mm and an EVA sheet 8 having a thickness of 0.4 mm was inserted in the above-described gap in order to ensure insulation between the solder-plated copper foil 5, 5' having the width of 5 mm and the surface of the element. The Tedler sheet 7 was white.

Alternatively, a two-layer sheet comprising an EVA sheet 6 having a length of 48 cm, a width of 2.5 cm and a thickness of 0.4 mm and a glass nonwoven fabric 7 having a thickness of 0.2 mm may be inserted in the gap. The EVA sheet 6 may be white.

At a central portion in a shorter side of the solar cell, end portions of solder-plated copper foils 5, 5' were bent with an interval of 2 cm toward the terminal box in a vertical direction to the substrate. The copper foils were held from above by an electric iron (with a face coated with Teflon) whose face was heated up to 130° C. and temporarily fixed.

An EVA sheet 9 was set above the resultant structure. The EVA sheet 9 was provided with slits 10 each having a length of 8 mm at locations corresponding to the bent end portions of wiring elements (copper foils) 5, 5'. The EVA sheet 9 had a width of 52 cm and a length of 104 cm. The end portions of the wiring elements 5, 5' were led out of the slits 10.

A Tedler sheet portion 11 having notches or slits each with a length of 8 mm was set on the led-out end portions of the wiring elements in the state in which the end portions of the wiring elements were passed through these notches or slits. In addition, an EVA sheet portion 12 of the same size was set.

A white three-layer film 13 of Tedler/Al foil/Tedler having openings 14 with each side of 1 cm was set as a back protection cover in the state in which the end portions of the wiring elements were passed through the openings 14. The end portions of the wiring elements were temporarily fixed by a heat-resistant tape at locations where the copper foils were not in contact with the opening.

These sheets were laminated by a vacuum laminator and the thin-film solar cell module of the present invention was manufactured.

A voltage of 1,500 V was applied for one minute between the terminals of the module and the Al layer in the back protection cover, and it was found that insulation was maintained.

To subject the module to high-temperature/high-humidity tests, the module was left for 1,000 hours in an environment in which the temperature was 85° C. and humidity was 85%. It turned out that there was no problem with the insulation between the terminals and protection cover of the module. The power generation characteristics of the solar cell module were unchanged before and after the high-temperature/high-humidity tests.

Thereafter, the module was disassembled. The filler in the module was completely maintained, and no water entered from the portions of taking out the solder-plated copper foils.

According to the present invention, in the solar cell having a thin-film solar cell as a constituent element, it is possible to greatly improve the reliability of those portions from which the wiring elements between the buses and the terminal box or the like are led out via the openings provided in the back protection cover.

According to this invention, the possibility of contact between the wiring elements and the metal in the back protection cover can be reduce to substantially zero by a simple additional structure wherein a small-area sheet is placed on the opening portions in the back protection cover.

According to the structure of this invention, the entire space between the substrate and the back protection cover is entirely filled with filler, and the filler is firmly adhered to the back protection cover, etc. By virtue of this structure, even if vapor passes through the openings of the back protection cover, it does not coagulate and the internal components are not corroded by water. Compared to the conventional thin-film solar cell module, the reliability can be greatly improved by the simple structure and manufacturing steps.

Entrance of water can be completely prevented by covering the openings in the back protection cover with an insulating sheet.

The above-mentioned manufacturing steps appear to be complex at a glance. However, in this invention, the vacuum lamination process is employed. The respective sheets are disposed and temporarily fixed by the iron, etc. This structure is put in the vacuum laminator, and the functional components are completed. In particular, the material with high vapor barrier properties is used for the insulating film covering the openings of the back protection cover. Thus, the prior-art step of caulking the opening portions with a silicone resin can be dispensed with. This step required a curing time. In this invention, this step can be omitted. The technique of this invention is very convenient.

The above descriptions have been directed to limited materials. This invention, however, is applicable to any structure wherein wiring for outputting power of a solar cell is led out of an opening in a back protection cover and a filler is filled in the inside of a cover of a solar cell element.

As has been described above, according to the present invention, compared to the prior art, the reliability of the thin-film solar cell module is remarkably enhanced by the simple steps of inserting the sheet-shaped insulating member and the filler sheet member.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thin-film solar cell module comprising:
   a transparent insulating substrate;
   a thin-film solar cell formed on said transparent insulating substrate, said thin-film solar cell having on said transparent insulating substrate a plurality of photovoltaic elements each comprising a transparent electrode layer, a photovoltaic thin-film semiconductor layer and a back electrode layer;
   a bus connected to said thin-film solar cell and formed on said transparent insulating substrate;
   sealing means provided on a surface of the thin-film solar cell, said sealing means comprising a filler and a back protection cover;
   connection means for outputting power from the thin-film solar cell; and
   a wiring element for connecting said bus and said connection means, said wiring element being buried in a filler, an insulating sheet buried in a filler being disposed between the wiring element and the back electrode layer.

2. A thin-film solar cell module according to claim 1, wherein said filler in which said wiring element is buried and said filler in which said insulating sheet is buried are formed of the same material as said filler of the sealing means.

3. A thin-film solar cell module according to claim 1, wherein said insulating sheet has the same color tone as the back protection cover.

4. A thin-film solar cell module according to claim 1, wherein said insulating sheet is formed of the same resin material as the back protection cover, and has the same color tone as the back protection cover.

5. A thin-film solar cell module according to claim 1, wherein said wiring element is one of a copper wire and a copper foil which are coated with one of solder and tin.

6. A thin-film solar cell module according to claim 1, wherein said filler in which said wiring element is buried and said filler in which said insulating sheet is buried are formed of a material having the same color tone as the back protection cover.

7. A thin-film solar cell module according to claim 1, wherein said filler in which said wiring element is buried and said filler in which said insulating sheet is buried are formed of one selected from the group consisting of ethylene-vinyl acetate copolymer (EVA), silicone, and polyvinylbutyral (PVB).

8. A thin-film solar cell module according to claim 1, wherein at least one of said wiring element and said bus is a solder-plated copper foil having a width of 2 mm or more, and a thickness of solder of said solder-plated copper foil is 50 μm or more.

9. A thin-film solar cell module according to claim 1, wherein at least one of said wiring element and said bus is a solder-plated copper foil having a width of 2 mm or more, and a thickness of solder of said solder-plated copper foil is 100 μm to 200 μm.

10. A thin-film solar cell module according to claim 1, wherein said insulating sheet is one of a glass nonwoven fabric sheet and a 160° C.-heat-resistant synthetic fiber fabric sheet.

11. A thin-film solar cell module according to claim 10, wherein said insulating sheet has the same color tone as the back protection cover.

12. A thin-film solar cell module according to claim 10, wherein said wiring element is one of a copper wire and a copper foil which are coated with one of solder and tin.

13. A thin-film solar cell module according to claim 10, wherein said filler in which said insulating sheet is buried is the same filler as said filler of said sealing means.

14. A thin-film solar cell module according to claim 10, wherein said filler in which said wiring element is buried and said filler in which said insulating sheet is buried are formed of one selected from the group consisting of ethylene-vinyl acetate copolymer (EVA), silicone, and polyvinylbutyral (PVB).

15. A thin-film solar cell module according to claim 10, wherein at least one of said wiring element and said bus is a solder-plated copper foil having a width of 2 mm or more, and a thickness of solder of said solder-plated copper foil is 50 μm or more.

16. A thin-film solar cell module according to claim 10, wherein at least one of said wiring element and said bus is a solder-plated copper foil having a width of 2 mm or more, and a thickness of solder of said solder-plated copper foil is 100 μm to 200 μm.

17. A thin-film solar cell module comprising:
   a transparent insulating substrate;
   a thin-film solar cell formed on said transparent insulating substrate, said thin-film solar cell having on said transparent insulating substrate a plurality of photovoltaic elements each comprising a transparent electrode layer, a photovoltaic thin-film semiconductor layer and a back electrode layer;
   a bus connected to said thin-film solar cell and formed on said transparent insulating substrate;
   connection means for outputting power from the thin-film solar cell;
   a wiring element for connecting said bus and said connection means; and
   sealing means provided on a surface of the thin-film solar cell, said sealing means comprising a filler and a back protection cover, said back protection cover having a metallic film therein and having an opening in which said wiring element is passed; and
   at least one insulator covering said opening of the back protection cover, wherein said insulator is one of a fluorine-based resin film, a glass nonwoven fabric and a 160° C.-heat-resistant fiber nonwoven fabric.

18. A method of manufacturing a thin-film solar cell module, comprising the steps of:
   forming a thin-film solar cell, the step of forming the thin-film solar cell including,
      forming a photovoltaic layer by successively stacking, on a transparent insulating substrate, a transparent electrode layer, a photovoltaic thin-film semiconductor layer and a back electrode layer,
      dividing said photovoltaic layer into a plurality of regions and forming a plurality of photovoltaic elements, and
      forming on said transparent insulating substrate a bus for deriving power from said photovoltaic elements;
   forming a wiring element between said bus and a connection means formed to derive power from the thin-film solar cell, said step of forming the wiring element including disposing successively a filler, an insulating sheet and a filler on said thin-filler solar cell and under the wiring element; and
   forming sealing means including a filler and a back protection cover, said step of forming the sealing means including disposing, on an entire surface of said thin-film solar cell, a filler sheet having an opening for leading out the wiring element to the connection means, and disposing, on said filler sheet, a back protection cover having a hole at a position corresponding to said opening of said filler sheet.

19. A method of manufacturing a thin-film solar cell module according to claim 18, further comprising, following said step of forming said wiring element and said step of forming said sealing means, a step of fixing, by a vacuum lamination step, said thin-film solar cell, said back protection cover, and the fillers, said filler sheet, said wiring element and said insulating sheet provided between said thin-film solar cell and said back protection cover.

20. A method of manufacturing a thin-film solar cell module according to claim 18, wherein said filler sheet and the two fillers disposed under the wiring element are formed of the same material.

21. A method of manufacturing a thin-film solar cell module according to claim 18, wherein said insulating sheet has the same color tone as the back protection cover.

22. A method of manufacturing a thin-film solar cell module according to claim 18, wherein said insulating sheet is formed of the same resin material as the back protection cover, and has the same color tone as the back protection cover.

23. A method of manufacturing a thin-film solar cell module according to claim 18, wherein said wiring element is one of a copper wire and a copper foil which are coated with one of solder and tin.

24. A method of manufacturing a thin-film solar cell module according to claim 18, wherein said filler sheet and the two fillers disposed under the wiring element are formed of a material having the same color tone as the back protection cover.

25. A method of manufacturing a thin-film solar cell module according to claim 18, wherein said filler sheet and the two fillers disposed under the wiring element are formed of a material which is melted by heat and cross-linked.

26. A method of manufacturing a thin-film solar cell module according to claim 18, wherein said filler sheet and the two fillers disposed under the wiring element are formed of one selected from the group consisting of ethylene-vinyl acetate copolymer (EVA), silicone, and polyvinylbutyral (PVB).

27. A method of manufacturing a thin-film solar cell module according to claim 18, wherein at least one of said wiring element and said bus is a solder-plated copper foil having a width of 2 mm or more, and a thickness of solder of said solder-plated copper foil is 50 $\mu$m or more.

28. A method of manufacturing a thin-film solar cell module according to claim 18, wherein at least one of said wiring element and said bus is a solder-plated copper foil having a width of 2 mm or more, and a thickness of solder of said solder-plated copper foil is 100 $\mu$m to 200 $\mu$m.

29. A method of manufacturing a thin-film solar cell module according to claim 18, wherein said insulating sheet disposed under the wiring element is one of a glass non-woven fabric sheet and a 160° C.-heat-resistant synthetic fiber fabric sheet.

30. A method of manufacturing a thin-film solar cell module according to claim 18, wherein said filler sheet and the fillers disposed under the wiring element are formed of one selected from the group consisting of ethylene-vinyl acetate copolymer (EVA), silicone, and polyvinylbutyral (PVB).

* * * * *